United States Patent [19]

Bae

[11] Patent Number: 5,508,133

[45] Date of Patent: Apr. 16, 1996

[54] PHOTO MASK

[75] Inventor: Sang M. Bae, Kyougki, Rep. of Korea

[73] Assignee: Hyundai Electronics Industries Co., Ltd., Rep. of Korea

[21] Appl. No.: 339,826

[22] Filed: Nov. 15, 1994

[30] Foreign Application Priority Data

Nov. 15, 1993 [KR] Rep. of Korea .................. 93-24234

[51] Int. Cl.⁶ .................................................. G03F 9/00
[52] U.S. Cl. ........................... 430/5; 430/311; 430/312; 430/313
[58] Field of Search ........................... 430/5, 311, 312, 430/313

[56] References Cited

U.S. PATENT DOCUMENTS

| | | | |
|---|---|---|---|
| 5,411,824 | 5/1995 | Vasudev et al. | 430/5 |
| 5,422,206 | 6/1995 | Kamon | 430/5 |

*Primary Examiner*—S. Rosasco
*Attorney, Agent, or Firm*—Merchant, Gould, Smith, Edell, Welter & Schmidt

[57] ABSTRACT

A photo mask used to form a positive photoresist film pattern at a region defined adjacent to a depression formed on a layer to be patterned, including a chromium pattern formed on a quartz substrate and a plurality of dot patterns formed on the quartz substrate and disposed adjacent to a portion of the chromium pattern overlapping with the depression of the layer to be patterned, the dot patterns being adapted to reduce an intensity of a light incident on a portion of the quartz substrate overlapping with the depression of the layer to be patterned, thereby capable of preventing an occurrence of a notching phenomenon, at a photoresist film pattern, caused by an irregular light reflection generated by a slant surface of the depression. The photo mask makes it possible to prevent the photoresist film pattern form being damaged due to a light exposure of an unintended portion of the photoresist film to a light reflected by the slant surface.

15 Claims, 7 Drawing Sheets

PHOTO MASK

BACKGROUND OF THE INVENTION

1. Field of the Invention

The present invention relates to a photo mask used in the fabrication of a semiconductor device, and more particularly to a photo mask capable of preventing an occurrence of a notching phenomenon an a photoresist film pattern, caused by an irregular light reflection generated at a depressed slant surface of a layer to be patterned upon a light exposure.

2. Description of the Prior Art

As a semiconductor device has an increased degree of integration, the space between a contact hole adapted to connect upper and lower conducting lines and the wiring surrounding the contact hole is decreased. Moreover, the increased integration degree results in an increase in the aspect ratio, that is the ratio of diameter to depth in the contact hole.

As a conducting layer is coated over the contact hole with the increased aspect ratio, a large depression is formed on the surface of the conducting layer overlapping with the contact hole. When a light exposure process is carried out under a condition that a photoresist film has been coated over the conduction layer, an irregular reflection of light through the photoresist film occurs at the depressed surface portion of the conduction layer. As a result, the photoresist film is exposed to light even at its undesired portion. When the light-exposed photoresist film is subjected to development, a notching phenomenon in which a pattern of the photoresist film is partially removed at its side walls may occur.

FIG. 1 is a plan view of a conventional structure of a semiconductor device involving a notching phenomenon occuring at a photoresist film pattern. As an upper layer is deposited over a semiconductor substrate 1, a depression 3 is formed on the upper layer due to a profile of the structure of the semiconductor substrate disposed beneath the upper layer. When a photoresist film pattern 2 is formed over the upper layer so as to pattern the upper layer, a notching phenomenon occurs at a poxriot of the photoresist film pattern 2 adjacent to the depression 3, in a severe case, the photoresist film pattern 2 is cut, such a notching phenomenon means that the photoresist film is undesirably removed, even at a portion that is intended to remain, due to an undesirable light exposure at the portion of photoresist film caused by an irregular reflection of light through the photoresist film occurring at the depressed surface portion of the upper layer.

Such an occurrence of the notching phenomenon at the photoresist film will be described in detail in conjunction with a method for fabricating a semiconductor device illustrated in FIGS. 2A and 2B, each of which is a cross-sectional view taken along the line II—II of FIG. 1.

In accordance with the illustrated method, first, a lower layer pattern 15 is formed on a semiconductor substrate 11, as shown in FIG. 2A. On the resulting structure, an intermediate layer pattern 16 is formed such that it overlaps with a predetermined portion of the structure, thereby exposing a predetermined portion of the semiconductor substrate 11. An upper layer 17, for example, a metal layer, is then deposited over the resulting structure to a predetermined thickness, over the upper layer 17, a positive photoresist film 18 is coated. Thereafter, the photoresist film 18 is subjected to a light exposure using a photo mask 20 including a quartz substrate formed with a chromium pattern. Since a depression is formed on a surface portion of the upper layer 17 disposed over an area where the lower layer pattern 15 and the intermediate layer pattern 16 are not disposed, light transmitted through the photoresist film during the light exposure is irregularly reflected at a slant surface portion of the upper layer 17 disposed adjacent to the depression, as shown in FIG. 2A. As a result, the photoresist film 18 is exposed even at its portion intended not to be exposed to the light.

Thereafter, a development is carried out to remove the light-exposed portion of the photoresist film 18 and thereby to form a photoresist film pattern 18A, as shown in FIG. 2B. By referring to FIG. 2B, it can be found that an inner portion of the photoresist film pattern 18A has been undesirably removed, that is, a notching phenomenon has occurred.

Subsequently, an upper layer pattern is formed by etching an exposed portion of the upper layer 17. Since the upper layer pattern has the same shape as the photoresist film pattern 18A undesirably notched, the width of the upper layer pattern is smaller than the intended width. As a result, an increase in electrical resistance may occur in a severe case, a disconnection may occur.

In other words, since the upper layer has a severely slanted surface portion at a region where a step is formed due to the lower layer, the non-exposure portion of the photoresist film is undesirably exposed to light reflected by the slant surface of the upper layer upon the light exposure for forming the upper layer pattern. Such a phenomenon occurs more severely where the reflection surface is made of a metal exhibiting a high reflection factor.

FIG. 3 is a plan view of another conventional structure of a semiconductor device involving a notching phenomenon occurring at a photoresist film pattern. In FIG. 3, elements respectively corresponding to those in FIG. 1 are denoted by the same reference numerals. As an upper layer is deposited over a semiconductor substrate 1, a depression 3 is formed on the upper layer due to a profile of the structure of the semiconductor substrate disposed beneath the upper layer. When a photoresist film pattern 2 formed over the upper layer so as to pattern the upper layer, a notching phenomenon occurs at a portion of the photoresist film pattern 2 adjacent to the depression 3. In a severe case, the photoresist film pattern 2 is cut. In other words, the photoresist film is undesirably removed, even at a portion that is intended to remain, during development thereof due to an undesirable light exposure at the portion of photoresist film caused by an irregular reflection of light through the photoresist film occurring at the depressed surface portion of the upper layer, as mentioned above in conjunction with FIG. 1.

Such an occurrence of the notching phenomenon at the photoresist film will be described in detail in conjunction with a method fox fabricating a semiconductor device illustrated in FIGS. 4A and 4B, each of which is a cross-sectional view taken along the line IV—IV of FIG. 3. The structure shown in FIGS. 4A and 4B is substantially similar to that in FIGS. 2A and 2B except for the position of the photoresist film pattern that is shifted due to a shifted position of the photo mask. In FIGS. 4A and 4B, elements respectively corresponding to those in FIGS. 2A and 2B ale denoted by the same reference numerals.

In accordance with this method, first, a lower layer pattern 15 is formed on a semiconductor substrate 11, as shown in FIG. 4A. An intermediate layer pattern 16 is then formed on the resulting structure such that it overlaps with a predetermined portion of the structure, thereby exposing a predetermined portion of the semiconductor substrate 11. Over the resulting structure, an upper layer 17, for example, a metal layer is deposited to a predetermined thickness. A positive photoresist film 18 is then coated over the upper layer 17. Thereafter, the photoresist film 18 is subjected to a light exposure using a photo mask 20 including a quartz substrate formed with a chromium pattern. Since the upper layer 17 has a depression at its surface portion disposed over an area where the lower layer pattern 15 and the intermediate layer pattern 16 are not disposed, the photoresist film 18 is exposed even at its non-exposure portion to light transmitted through the photoresist film during the light exposure and then reflected by a slanted surface portion of the upper layer 17 disposed adjacent to the depression, as shown in FIG. 4A.

Thereafter, the light-exposed portion of the photoresist film 18 is removed by a development, thereby forming a photoresist film pattern 18B, as shown in FIG. 4B. By referring to FIG. 4B, it can be found that a notching phenomenon has occurred at a portion of the photoresist film pattern 18B overlapping with the depression.

Subsequently, an upper layer pattern is formed by etching an exposed portion of the upper layer 17. Since the upper layer pattern has the same shape as the photoresist film pattern 18B undesirably notched, the width of the upper layer pattern is smaller than the intended width. As a result, an increase in electrical resistance may occur. In a severe case, a disconnection may occur.

As apparent from the above description, the conventional structures have a problem of the occurrence of the notching phenomenon in that a portion of the photoresist film pattern is undesirably removed because the photoresist film is undesirably exposed at its non-exposure portion to light reflected by a slanted surface of upper layer, formed due to the step of the lower layer pattern, upon the light exposure for forming the upper layer pattern. Such a problem is more severe where the slanted surface is made of a metal exhibiting a high reflection factor.

In order to solve the above-mentioned problem, there has been proposed a method wherein an upper surface of a substrate is planarized by coating a material exhibiting a high flowability such as boro phosphor silicate glass (BPSG) over a lower layer pattern on the substrate, thereby reducing an irregular reflection of light. There has also been proposed a method of an anti-reflection layer made of a material exhibiting a low reflection factor. In this case, the anti-reflection layer is coated over an upper layer or a photoresist film prior to a formation of a photoresist film pattern. However, these methods require additional steps, as compared to the general photoresist film pattern formation. As a result, they have the problems of a degradation in productivity, an increased fabrication cost and a complex fabrication.

SUMMARY OF THE INVENTION

Theretype, an object of the pre sent Invention is to provide a photo mask capable of preventing the occurrence of a notching phenomenon at a photoresist film pattern caused by an irregular light reflection generated at a region where a depression is formed, and to provide a method for fabricating the photo mask.

DETAILED DESCRIPTION OF THE PREFERRED EMBODIMENTS

Figure 5:
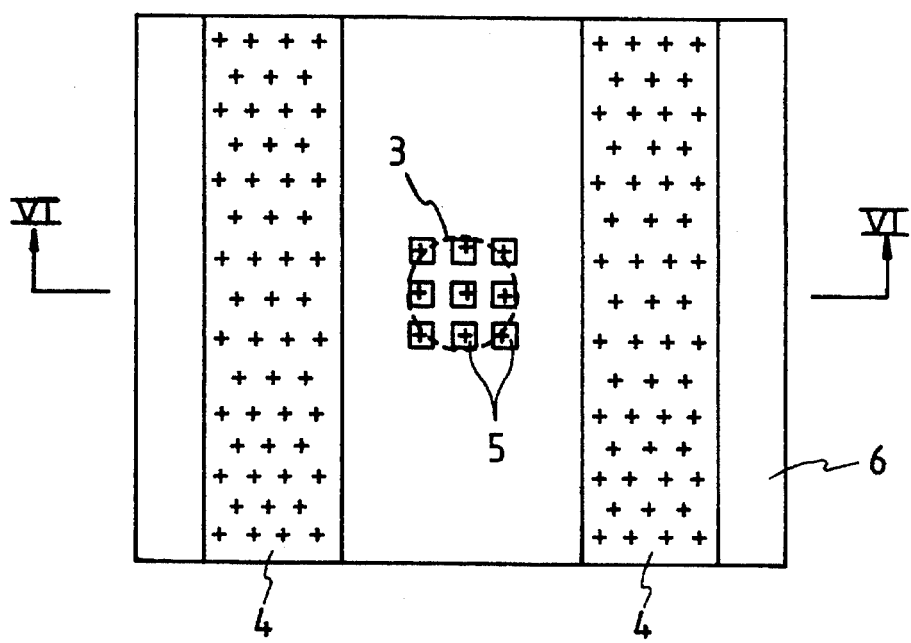
FIG. 5 is a plan view illustrating a photo mask in accordance with the present invention.
Figure 6:
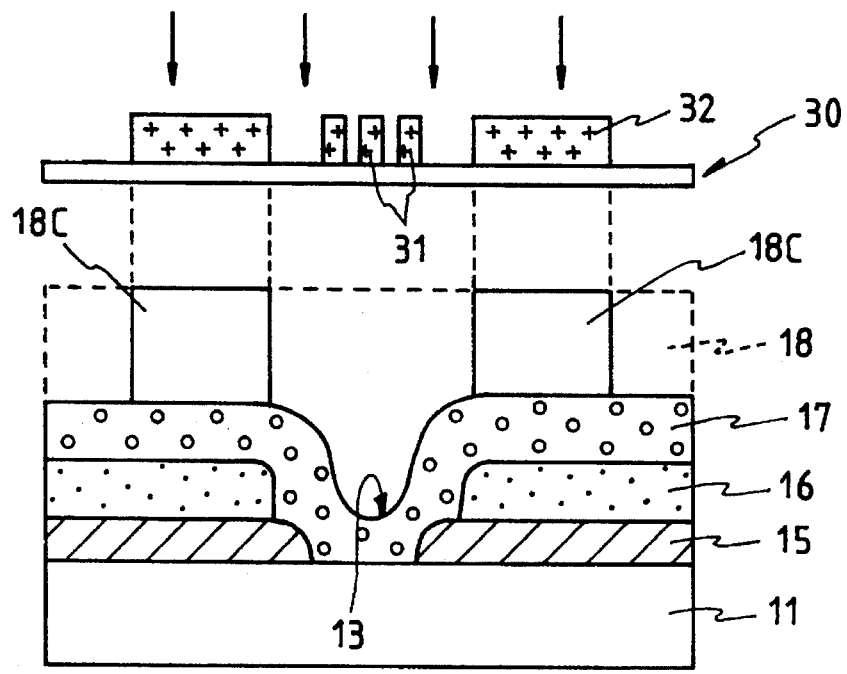
FIG. 6 is a cross-sectional view taken along line VI—VI of FIG. 5.

FIGS. 5 and 6 illustrate a photo mask used in the fabrication of a semiconductor device in accordance with a first embodiment of the present invention and formation of a photoresist film pattern using the photo mask, respectively.

FIG. 5 is a plan view illustrating the photo mask. As shown in FIG. 5, the photo mask includes a chromium pattern 4 as a line pattern formed on a quartz substrate 6, as in the conventional case. The photo mask also includes a plurality of dot patterns 5 formed on the quartz substrate 6 at a region where a depression 3 formed on a layer to be patterned is disposed, Each of the dot patterns 5 has a dimension capable of preventing a formation of a pattern of a photoresist film even when the photoresist film is exposed to light through the photo mask. Preferably, each dot pattern 5 has a square shape with a dimension of 0.1 to 0.3 μm at each side. The dot patterns 5 may be comprised of a chromium layer or a phase inversion material layer such as a quartz layer or a silicon-on-glass (SOG) layer.

When a photoresist film is subjected to a light exposure using the photo mask with the dot patterns B, even a portion of the photoresist film disposed beneath the dot patterns 5 is exposed to light, so that it is completely removed upon a development. However, a portion of the photoresist film disposed at a non-exposure region is not exposed to light because light irregularly reflected by a depression formed at a layer to be patterned is decreased in intensity by virtue of the dot patterns 5.

Figure 1:
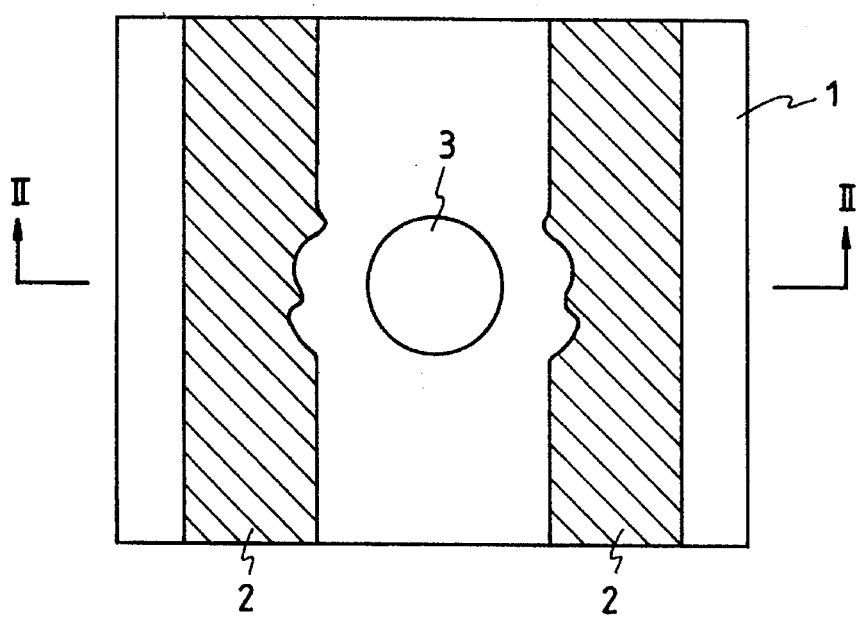
FIG. 1 is a plan view of a conventional semiconductor device.
Figure 3:
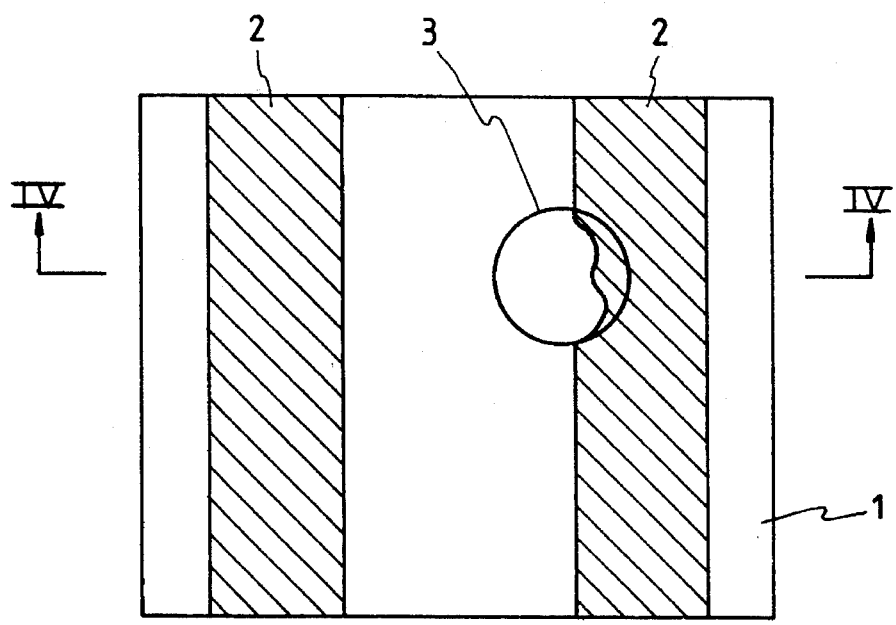
FIG. 3 is a plan view of another conventional semiconductor device.
Figure 2A:
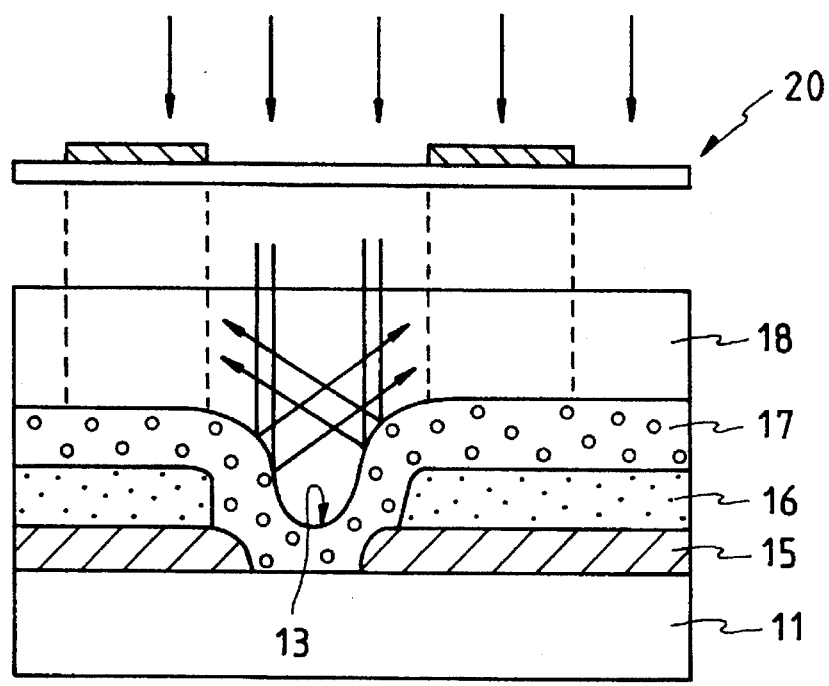
FIGS. 2A and 2B are cross-sectional views taken along line II—II of FIG. 1.
Figure 2B:
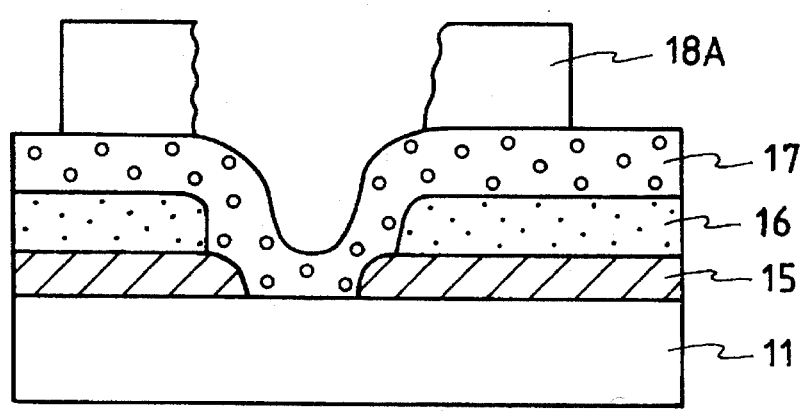
Figure 4A:
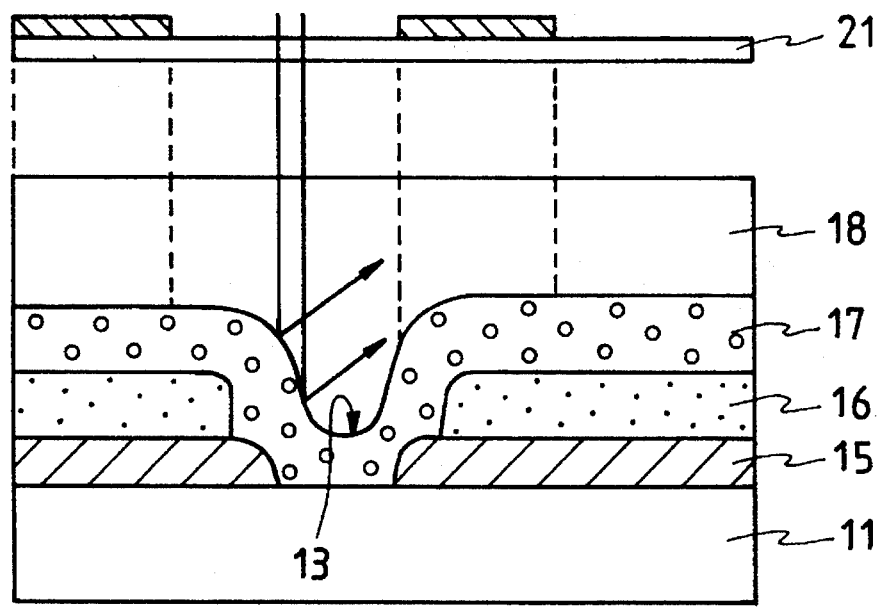
FIGS. 4A and 4B are cross-sectional views taken along line IV—IV of FIG. 3.
Figure 4B:
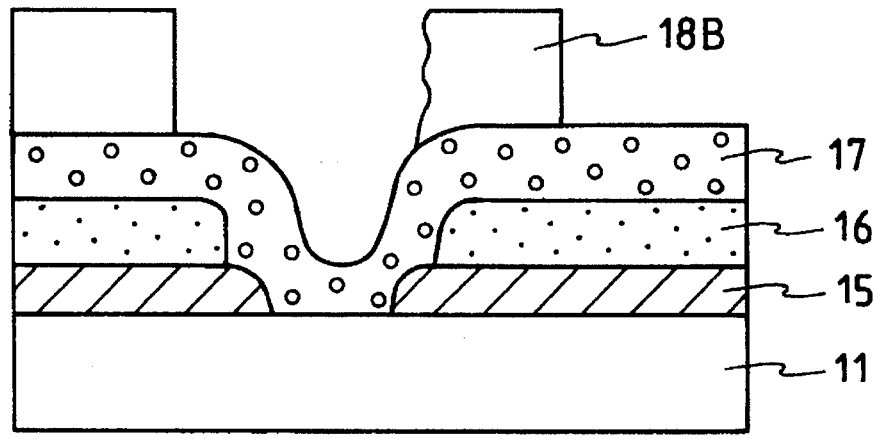

FIG. 6 is a cross-sectional view taken along the line VI—VI of FIG. 5, illustrating the formation of a positive photoresist film pattern on a layer to be patterned using the photo mask shown in FIG. 5. In FIG. 6, elements respectively corresponding to those in FIGS. 2A and 2B are denoted by the same reference numerals.

Over a semiconductor substrate 11, first, a lower layer pattern 15 and an intermediate layer pattern 16 are sequentially formed. Over the resulting structure, an upper layer 17, for example, a metal layer is deposited. A photoresist film 18 is coated over the upper layer 17. The photoresist film 18 is then subjected to a light exposure using a photo mask 30 having a structure shown in FIG. 5. Using a development process, a light-exposed exposed of the photoresist film 18 is removed, thereby forming a photoresist film pattern 18C. After the formation of the upper layer 17, a depression 13 is formed on the surface of upper layer 17 due to the lower and intermediate layer patterns 15 and 16. However, the photoresist film 18 is not affected by the depression 13 during the light exposure because an irregular reflection of light transmitting the photoresist film 18 generated by the depression 13 is reduced by virtue of the dot patterns 5. As a result, the photoresist film pattern 18C formed after development has the intended width.

Figure 7:
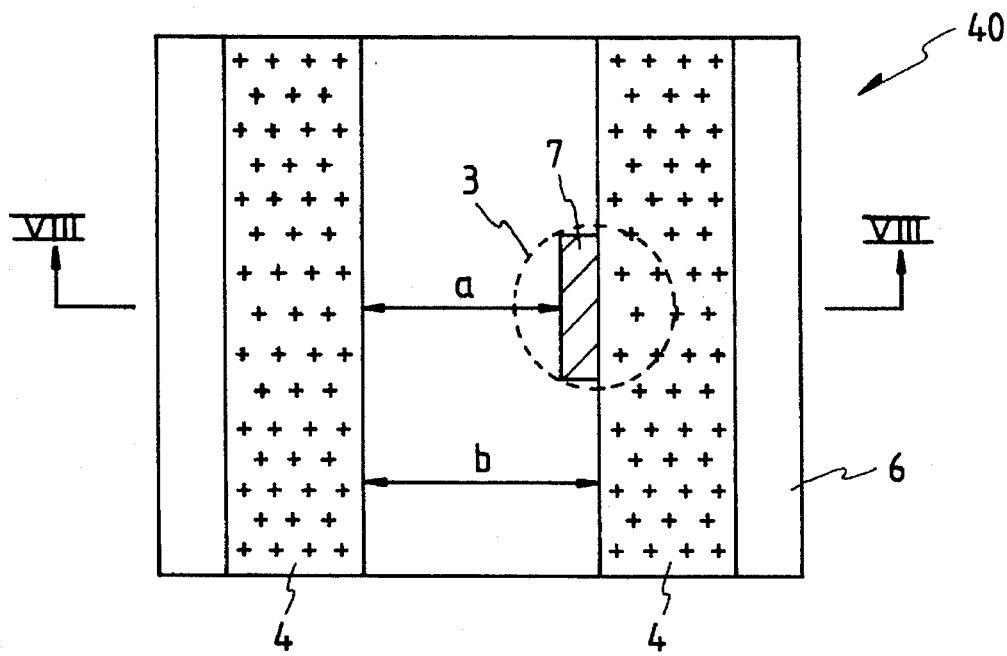
FIG. 7 is a plan view of a second embodiment of the present invention.
Figure 8:
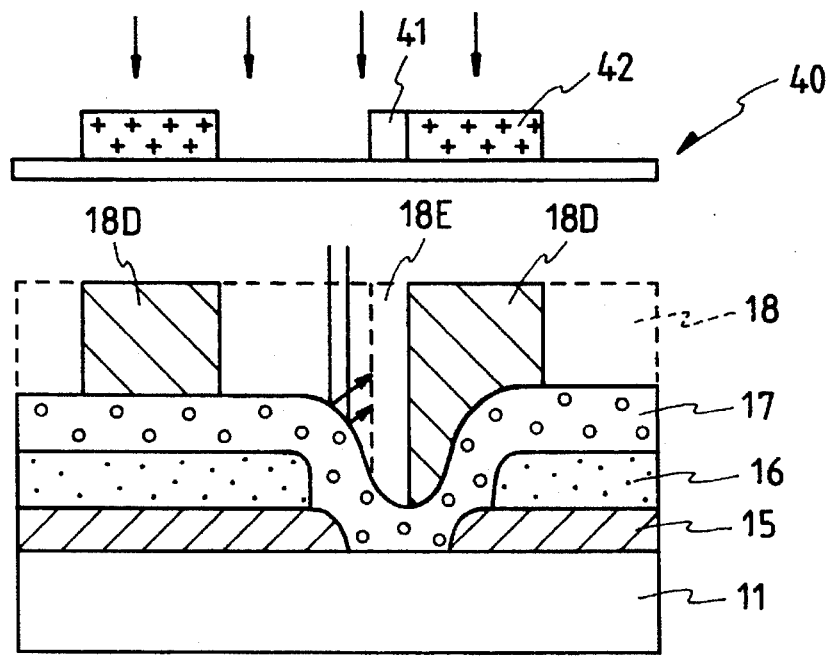
FIG. 8 is a cross-sectional view taken along line VIII—VIII of FIG. 7.

On the other hand, FIGS. 7 and 8 illustrate a photo mask fabricated in accordance with a second embodiment of the present invention and formation of a photoresist film pattern using the photo mask, respectively. In FIGS. 7 and 8, elements respectively corresponding to those in FIGS. 5 and 6 are denoted by the same reference numerals.

FIG. 7 is a plan view illustrating the photo mask having a structure in accordance with the second embodiment of the present invention. As shown in FIG. 7, the photo mask which is denoted by the reference numeral 40 includes a chromium pattern 4 as a line pattern formed on a quartz substrate 6, as in the conventional case. The photo mask 40 also includes a non-transparent film pattern 7 formed on the quartz substrate 6 at a region where a depression 3 formed on a layer to be patterned overlaps with the chromium pattern 4. The non-transparent film pattern 7 may be formed simultaneously with the formation of the chromium pattern 4.

The space in between the non-transparent film pattern 7 and a line portion of the chromium pattern 4 spaced away from the non-transparent film pattern 7 is determined to be within a space range sufficiently resolvable by a wavelength from a light exposure device. Where the space between adjacent portions of the upper layer pattern obtained by the photo mask 40 is 1 µm, a line resolution of 0.5 µm is obtained. Accordingly, the formation of the additional pattern does not cause any problem in fabrication of a semiconductor device.

FIG. 8 is a cross-sectional view taken along the line VIII—VIII of FIG. 7, illustrating the formation of a positive photoresist film pattern using the photo mask 40 fabricated in accordance with the second embodiment of the present invention.

Over a semiconductor substrate 11, first, a lower layer pattern 15 and an intermediate layer pattern 16 are sequentially formed. Over the resulting structure, an upper layer 17, for example, a metal layer is deposited. A photoresist film 18 is coated over the upper layer 17. The photoresist film 18 is then subjected to a light exposure using the photo mask 40 under a condition that the non-transparent film pattern 41 of the photo mask 40 overlaps with a depressed portion of the upper layer 17. Using a development process, a light-exposed portion of the photoresist film 18 is removed, thereby forming a photoresist film pattern 18D.

Although light incident on the upper surface of photo mask 40 is shielded by the non-transparent film pattern 41, a portion 18E of the photoresist film 18 disposed beneath the non-transparent film pattern 42 is exposed to light because light transmitted through the photoresist film 18 at a light exposure region is irregularly reflected by the depressed slant surface of the upper layer 17. As the development process is carried out to remove a portion of the photoresist film 18 disposed at the light exposure region, the photoresist film portion 18E disposed beneath the non-transparent film pattern 41 is also removed. As a result, the photoresist film pattern 18D having a good profile is obtained.

Figure 9:
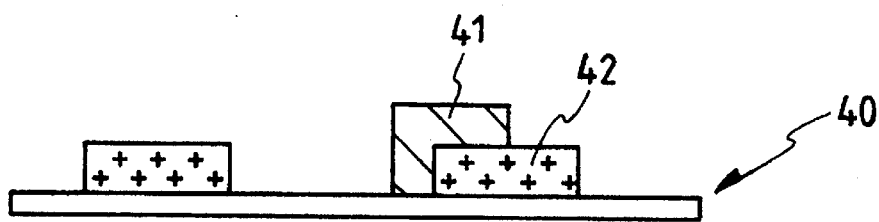
FIG. 9 is a sectional view of the photo mask 40 fabricated in accordance with the second embodiment.

FIG. 9 is a sectional view of the photo mask 40 fabricated in accordance with the second embodiment of the present invention. In this case, the non-transparent film pattern 41 is not formed at the step of forming the chromium pattern 42, but is formed using a separate step.

Figure 10:
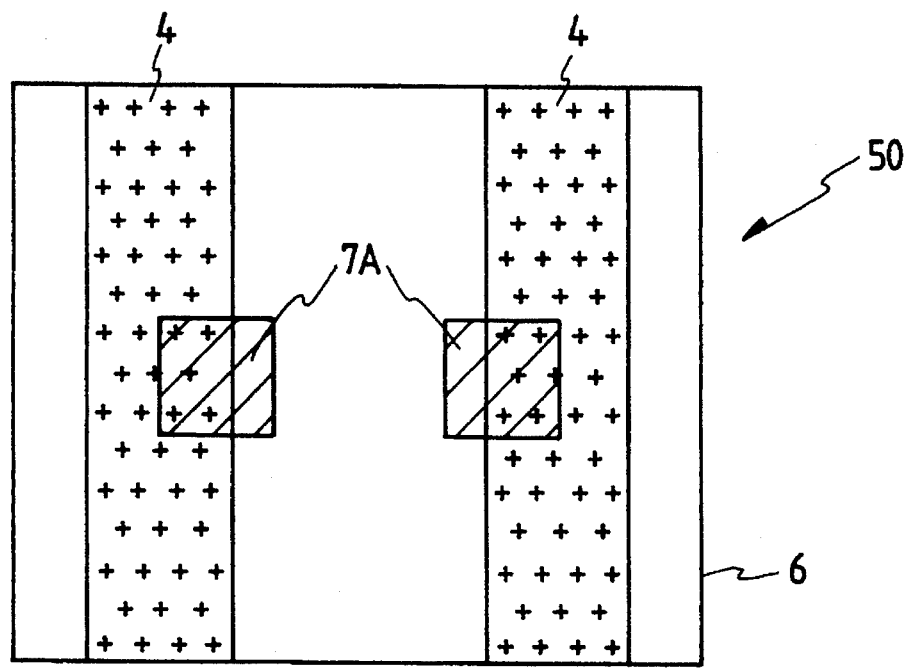
FIG. 10 is a plan view of a third embodiment of the present invention.

FIG. 10 is a plan view illustrating a photo mask fabricated in accordance with a third embodiment of the present invention. As shown in FIG. 10, the photo mask which is denoted by the reference numeral 50 includes a chromium pattern 4 formed on a quartz substrate 6 and a non-transparent film pattern 7A formed on the quartz substrate 6 at a portion of a light exposure region where a depression formed on a layer to be patterned is disposed adjacent to the chromium pattern 4. The non-transparent film pattern 7A is adapted to prevent the layer to be patterned, namely, a photoresist film, from being notched. The non-transparent film pattern 7A serves to shield light incident on the upper surface of photo mask 50. However, a portion of a photoresist film disposed beneath the non-transparent film pattern 7A upon a light exposure is exposed to light by virtue of an irregular reflection of light by a depressed slanted surface of an upper layer disposed beneath the photoresist film. By a development process, the photoresist film portion disposed beneath the non-transparent film pattern 7A is removed. In this case, the notching phenomenon does not occur because a portion of the photoresist film disposed at the non-exposure region is not exposed to light.

Figure 11:
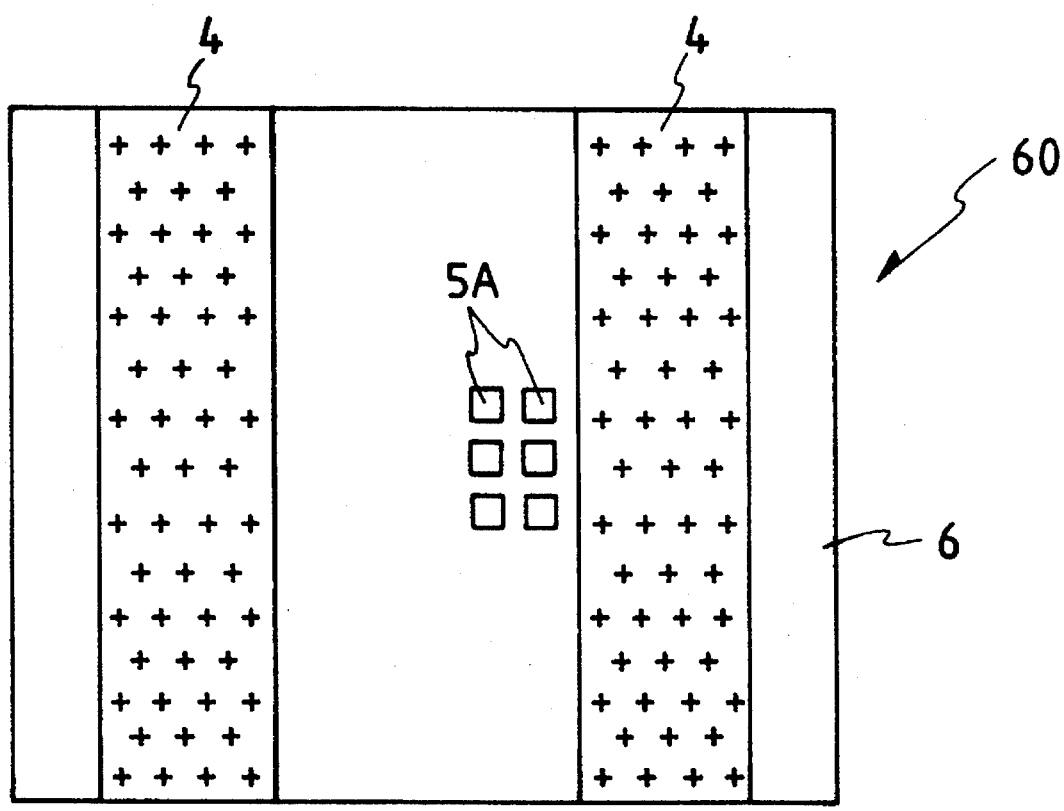
FIG. 11 is a plan view of a fourth embodiment of the present invention.

FIG. 11 is a plan view illustrating a photo mask fabricated in accordance with a fourth embodiment of the present invention. As shown in FIG. 11, the photo mask which is denoted by the reference numeral 60 includes a chromium pattern 4 formed on a quartz substrate 6 and a plurality of dot patterns 5A formed on the quartz substrate 6 at a portion of a light exposure region where a depression formed on a layer to be patterned is disposed adjacent to the chromium pattern 4. The dot patterns 5A are adapted to prevent a photoresist film disposed over the layer from being notched. The dot patterns 5A serve to reduce the intensity of light incident on the upper surface of photo mask 60. However, a portion of a photoresist film disposed beneath the dot patterns 5A upon a light exposure is sufficiently exposed to tightly virtue of an irregular reflection of light by a depressed slanted surface of an upper layer disposed beneath the photoresist film. In this case, the dot patterns 5A prevent a portion of the photoresist film disposed at the non-exposure region from being exposed to light.

As apparent from the above description, the present invention provides a photo mask having a structure capable of preventing an occurrence of a notching phenomenon, at a photoresist film pattern, caused by an irregular light reflection generated by a slant surface of the depression.

Where the photo mask in accordance with the present invention is used, fabrication of a semiconductor device is simplified, as compared to a triple-layer resist method and a method using a material of low reflection factor, the methods which are used to prevent the occurrence of the notching phenomenon. Accordingly, it is possible to achieve an enhancement in yield and an improvement in reliability.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A photo mask used to form a positive photoresist film pattern at a region defined adjacent to a depression formed on a layer to be patterned, comprising:

a quartz substrate; and a plurality of dot patterns formed on the quartz substrate at a position corresponding to the position of the depression on the layer to be patterned and adapted to reduce an intensity of a light incident on a portion of the photo mask overlapping with the depression of the layer to be patterned.

2. A photo mask in accordance with claim 1, wherein each of the dot patterns has a square shape having a dimension of 0.1 to 0.3 µm at each side thereof.

3. A photo mask in accordance with claim 1, wherein each of the dot patterns is made of a chromium or a phase shift material.

4. A photo mask used to form a positive photoresist film pattern at a region defined adjacent to a depression formed on a layer to be patterned, comprising:

a quartz substrate;

a chromium pattern formed on the quartz substrate; and a plurality of dot patterns formed on the quartz substrate and disposed adjacent to a portion of the chromium pattern overlapping with the depression of the layer to be patterned, the dot patterns being adapted to reduce an intensity of a light incident on a portion of the quartz substrate overlapping with the depression of the layer to be patterned.

5. A photo mask in accordance with claim 4, wherein each of the dot patterns has a square shape having a dimension of 0.1 to 0.3 µm at each side thereof.

6. A photo mask in accordance with claim 4, wherein each of the dot patterns is made of a chromium or a phase shift material, 7. A photo mask used to form a positive photoresist film pattern at a region defined adjacent to a depression formed on a layer to be patterned, comprising:

a quartz substrate;

a chromium pattern formed on the quartz substrate; and a non-transparent film pattern formed on the quartz substrate and adapted to shield a light incident on a portion of the photo mask disposed adjacent to a portion of the chromium pattern overlapping with the depression of the layer to be patterned.

8. A photo mask in accordance with claim 7, wherein the non-transparent film pattern is made of chromium.

9. A photo mask in accordance with claim 7, wherein the non-transparent film pattern is disposed at a legion overlapping with the depression of the layer to be patterned.

10. A photo mask in accordance with claim 7, wherein the non-transparent film pattern has a dimension proportional to a thickness of a photoresist film to be exposed to a light irregularly reflected by the depression of the layer to be patterned.

11. A photo mask used to form a positive photoresist film pattern at a region defined adjacent to a depression formed on a layer to be patterned, comprising:

a quartz substrate;

a chromium pattern formed on the quartz substrate; and a pattern formed on the quartz substrate and adapted to reduce an intensity of a light incident through the photo mask on a predetermined portion of a light exposure region defined at one side portion of the chromium pattern disposed adjacent to a region where the depression is disposed.

12. A photo mask in accordance with claim 11, wherein the pattern comprises a non-transparent film pattern.

13. A photo mask in accordance with claim 11, wherein the pattern is made of a phase shift material.

14. A photo mask used to form a positive photoresist film pattern at a region defined adjacent to a depression formed on a layer to be patterned, comprising:

a quartz substrate; and a plurality of dot patterns formed on the quartz substrate and adapted to reduce an intensity of a light incident on a portion of the photo mask overlapping with the depression of the layer to be patterned, each of the dot patterns having a dimension capable of preventing the formation of a pattern in a photoresist film even when the photoresist film is exposed to light transmitted through the photo mask.

15. A photo mask used to form a positive photoresist film pattern at a region defined adjacent to a depression formed on a layer to be patterned, comprising:

a quartz substrate;

a chromium pattern formed on the quartz substrate; and a plurality of dot patterns formed on the quartz substrate and disposed adjacent to a portion of the chromium pattern overlapping with the depression of the layer to be patterned, the dot patterns being adapted to reduce an intensity of a light incident on a portion of the quartz substrate overlapping with the depression of the layer to be patterned, and each of the dot patterns having a dimension capable of preventing the formation of a pattern in a photoresist film even when the photoresist film is exposed to light transmitted through the photo mask.

\* \* \* \* \*